(12) United States Patent
Weber et al.

(10) Patent No.: US 7,226,843 B2
(45) Date of Patent: Jun. 5, 2007

(54) INDIUM-BORON DUAL HALO MOSFET

(75) Inventors: Cory E. Weber, Hillsboro, OR (US); Gerhard Schrom, Hillsboro, OR (US); Ian R. Post, Portland, OR (US); Mark A. Stettler, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 388 days.

(21) Appl. No.: 10/261,715

(22) Filed: Sep. 30, 2002

(65) Prior Publication Data

US 2004/0061187 A1   Apr. 1, 2004

(51) Int. Cl.
  *H01L 21/336*   (2006.01)
  *H01L 31/119*   (2006.01)
(52) U.S. Cl. .................. 438/305; 438/306; 257/344; 257/408
(58) Field of Classification Search ......... 438/301, 438/302, 305, 306, 276–278, 307; 257/344, 257/408
  See application file for complete search history.

(56) References Cited

U.S. PATENT DOCUMENTS 5,985,727 A * 11/1999 Burr ........................... 438/302
6,555,437 B1 * 4/2003 Yu ............................. 438/300

OTHER PUBLICATIONS

Jinning Liu, Ukyo Jeong, Sandeep Mehta, Joe Sherbondy, Andy Lo, Kyu Ha Shim, and Jae Eun Lim, "Investigation of Indium Activation by C-V Measurement," Proc. Ion Impl. Tech. Conf., Sep. 17, 2000, pp. 66-69.*
J.S. Williams and R.G. Elliman, "Substitutional Solid Solubility Limits During Solid Phase Epitaxy of Ion Implanted (100) Silicon," Appl. Phys. Lett., vol. 40 (Feb. 1, 1982) pp. 266-268.*
Odanaka et al., "Double Pocket Architecture Using Indium and Boron for Sub-100 NM MOSFETS," IEEE Electron Device Letters, vol. 22, No. 7, Jul. 2001, pp. 330-332.
Miyashita et al., "Optimized Halo Structure for 80 nm Physical Gate CMOS Technology with Indium and Antimony Highly Angled Ion Implantation," IEDM Technical Digest International, Dec. 1999, pp. 645-648.
Onimatsu et al., "Influence of Extension Formation Process on Indium Halo Profile," Extended Abstracts of the 2001 International Conference on Solid State Devices, 2001, pp. 184-185.
Noda et al., "Effects of End-of Range Dislocation Loops on Transient Enhanced Diffusion of Indium Implanted in Silicon," Journal of Applied Physics, vol. 88, No. 9, Nov. 2000, pp. 4980-4984.

* cited by examiner

*Primary Examiner*—Hung Vu
(74) *Attorney, Agent, or Firm*—Blakely, Sokoloff, Taylor & Zafman LLP

(57) ABSTRACT

A method including forming a transistor device having a channel region; implanting a first halo into the channel region; and implanting a second different halo into the channel region. An apparatus including a gate electrode formed on a substrate; a channel region formed in the substrate below the gate electrode and between contact points; a first halo implant comprising a first species in the channel region; and a second halo implant including a different second species in the channel region.

16 Claims, 6 Drawing Sheets

INDIUM-BORON DUAL HALO MOSFET

BACKGROUND

1. Field

Circuit devices and methods for forming circuit devices.

2. Background

The field effect transistor (FET) is a common element of an integrated circuit such as a multiprocessor or other circuit. The transistor typically includes a source and drain junction region formed in a semiconductor substrate and a gate electrode formed on a surface of the substrate. The gate length is generally the distance between the source and drain junction region. Within the substrate, the region of the substrate beneath the gate electrode and between the source and drain junctions is generally referred to as a channel with a channel length being the distance between the source and drain junctions.

As noted above, many transistor devices are formed in a semiconductor substrate. To improve the conductivity of the semiconductor material of the substrate, dopants are introduced (e.g., implanted) into the substrate. Representatively, an N-type transistor device may have source and drain region (and gate electrode) doped with an N-type dopant such as arsenic. The N-type junction regions are formed in a well that has previously been formed as a P-type conductivity. A suitable P-type dopant is boron.

A transistor device works generally in the following way. Carriers (e.g., electrons, holes) flow between source junction and drain junction by the establishment of contacts on the substrate to the source and drain junction. In order to establish the carrier flow, a sufficient voltage must be applied to the gate electrode to form an inversion layer of carriers in the channel. This minimum amount of voltage is generally referred to as a threshold voltage ($V_t$).

In general, when fabricating multiple transistors of similar size, it is desired that a performance characteristic like threshold voltage be similar between devices. In general, the threshold voltage tends to decrease in response to reduced gate length. Of course, performance is often dictated by a reduction in transistor size (e.g., faster switching, more devices on a chip, etc.) that dominates the objectives of the semiconductor processing industry. As gate electrode lengths approach dimensions less than 100 nanometers (nm), what is seen is that the threshold voltage drops off or decreases rapidly. Therefore, even a small change in the gate electrode length (e.g., a 10 nanometer difference from a targeted length), can significantly affect the threshold voltage.

Ideally, the threshold voltage should be constant over a range of gate lengths about a target gate length to account for manufacturing margins. To, in one aspect, promote a more constant threshold voltage over a range of acceptable gate lengths, locally implanted dopants (P-type in N-type metal oxide semiconductor FETS (NMOSFETS) and N-type dopants in P-type metal oxide semiconductor FETS (PMOSFETS) may be introduced under the gate edges. Such implants are referred to as "halo" implants. The implanted dopant tends to raise the doping concentration around the edges of the channel, thereby increasing the threshold voltage. One effect is to reduce the threshold voltage of the target size device while maintaining the threshold voltage of the worst case size device.

Typical halo implants for NMOSFETS include boron (e.g., boron fluoride ($BF_2$)) and indium (In). Halo implants for PMOSFETS include arsenic, antimony, and phosphorous. With respect to NMOSFETS, indium is a particularly preferred dopant because the channel of indium forms a retrograde profile from the surface of the device. Such a concentration profile with respect to indium, tends to decrease the threshold voltage required to meet a given leakage current ($I_{off}$) in the device relative to a boron dopant which does not have the same retrograde profile. One problem with indium is that indium achieves a state of solid solubility at a point below the concentration required to reach worst case leakage currents. Thus, to target small leakage currents (e.g., on the order of 40 nanoamps (na) at device sizes less than 100 nanometers (nm)), a halo implant of an indium species alone cannot reach such targets.

BRIEF DESCRIPTION OF THE DRAWINGS

The features, aspects, and advantages of the invention will become more thoroughly apparent from the following detailed description, appended claims, and accompanying drawings in which:

DETAILED DESCRIPTION

As noted above, indium is a preferred NMOSFET channel dopant (e.g., halo dopant) because its retrograde concentration profile results in lower threshold voltages and improved drive currents. However, for smaller devices, such as devices with target gate length at 60 nanometers or less, indium alone as a halo dopant is unacceptable because its solid solubility limit tends to prevent indium from doping an NMOSFET channel to a high enough level to maintain reasonable worst-case leakage currents.

Figure 1:
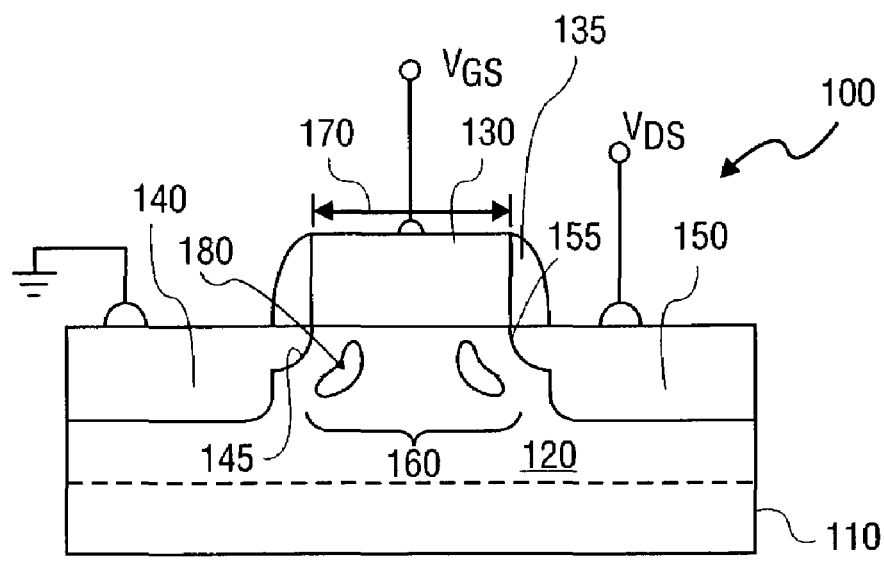
FIG. 1 shows a cross-sectional side view of a portion of a circuit substrate including a transistor device having a first halo implant.

FIG. 1 shows a cross-sectional side view of a portion of a circuit substrate having a transistor device formed thereon. Structure 100 includes substrate 110 of, for example, a semiconductor material, representatively silicon. Formed in and on substrate 110 in FIG. 1 is a transistor device. Representatively, the transistor device is an NMOSFET, formed in P-type well 120. The transistor device includes gate electrode 130 formed on the surface of substrate 110 having gate length 170. The transistor device also includes source junction 140 and drain junction 150. In an NMOSFET, source junction 140 and drain junction 150 are both N-type as typically is gate electrode 130. Source junction 140 includes tip implant 145 formed, for example, as self-aligned to gate electrode 130 (by an implant prior to the formation of spacer portions 135). The bulk of source junction 140 is aligned to spacer portions 135 on gate electrode 130 (by an implant after spacer portions 135 are formed). Similarly, drain junction 150 includes tip implant 155 substantially aligned to gate electrode 130 (e.g., a lightly-doped drain). The bulk of drain junction 150 is aligned to spacers 135 on gate electrode 130.

FIG. 1 also shows a single halo implant in channel region 160 of substrate 110. In an embodiment where the transistor device is an NMOSFET, first implant 180 is, for example, indium. Halo implants may be formed by introducing dopant ions, such as indium ions, into substrate 110 at a tilt angle of, for example, 25–30°. One way to introduce first halo 180 is an implanting operation after formation of the gate electrode (but before the spacers) so that the gate electrode acts as an aligned implant mask.

Figure 2:
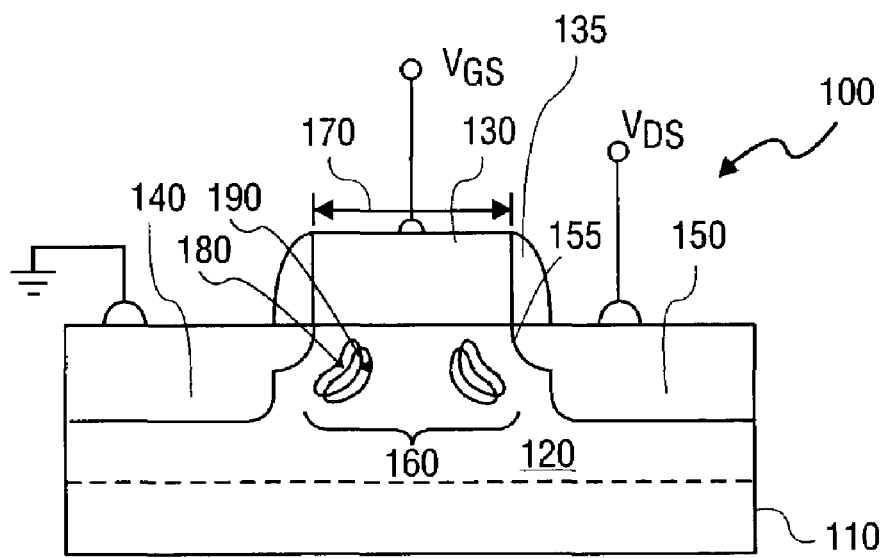
FIG. 2 shows the device of FIG. 1 following a second halo implant.

FIG. 2 shows the structure of FIG. 1 following the introduction of second halo 190. For an NMOSFET as shown, representatively, where first halo 180 is an indium species, second halo 190 is, for example, a boron species (e.g., boron diflouride). Second halo 190 may be introduced by implantation according to a similar technique as first halo 180.

In the example where first halo 180 is indium, and second halo 190 is boron or similar species, one technique involving multiple halos includes introducing first halo 180 into channel 120 of substrate 110 to a solid solubility of indium for silicon, generally $2E18\ cm^{-3}$. Following the implantation of an indium species to the indium solid solubility, a boron species is implanted as second halo 190 in an amount sufficient to achieve a target threshold voltage for a particular gate length device. It is appreciated that, having determined the appropriate amount of indium and boron dopants, the order by which either is introduced may vary.

Figure 3:
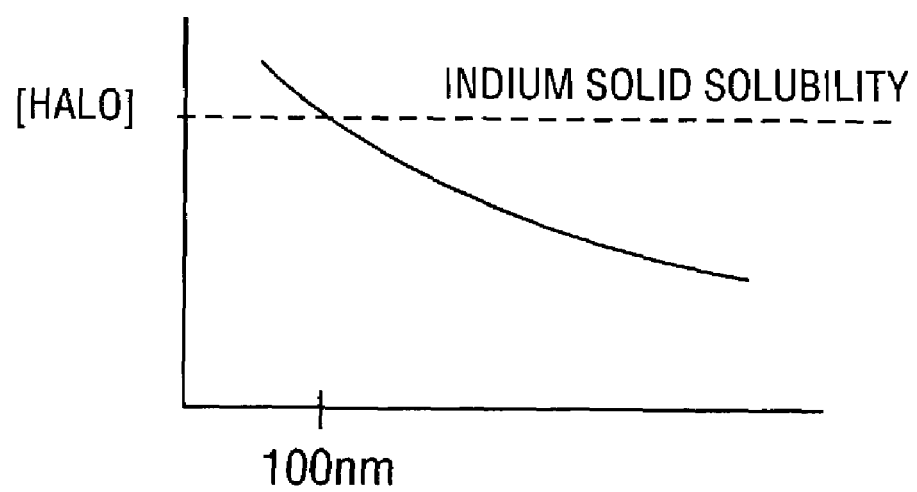
FIG. 3 shows a graphical representation of halo concentration in a substrate versus gate length for a selected leakage current.
Figure 4:
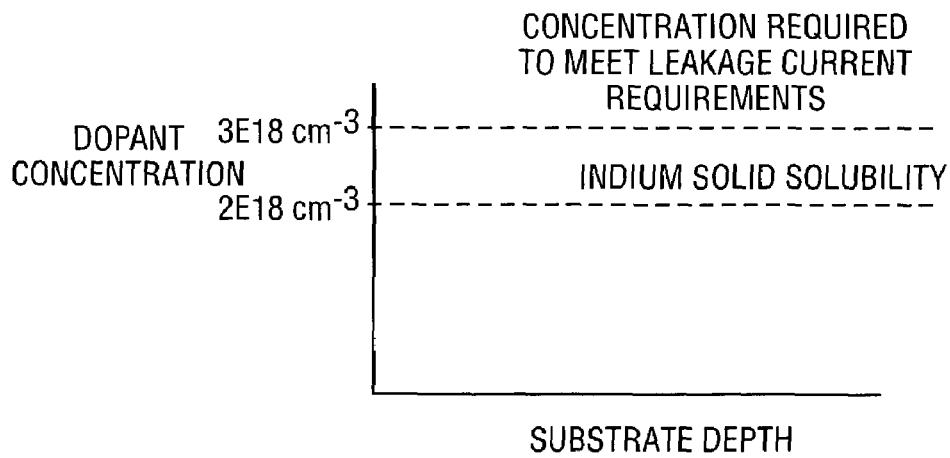
FIG. 4 shows the dopant concentration for P-type dopants in a silicon substrate.

In the above embodiment, a first halo (e.g., first halo 180) of an indium species is introduced and a second halo (e.g., second halo 190) is introduced. Thus, structure 100 includes two halos introduced into channel 120. The dopants described include indium and boron species. It is appreciated that other species may similarly be suitable for either NMOSFETS or PMOSFETS. In one example, indium is selected and introduced to its solid solubility in the context of reduced gate lengths (e.g., on the order of 70 nanometers or less) to achieve target threshold voltages, leakage currents and drive currents. FIG. 3 shows a graphical representation of halo concentration in a silicon substrate versus gate length for a selected leakage current ($I_{off}$) of, for example, 40 nA. FIG. 3 shows that as gate lengths are decreased beyond approximately 100 nm, indium saturates and cannot, alone, achieve the desired leakage current. FIG. 4 representatively shows halo concentration in a silicon substrate. FIG. 3 demonstrates that a concentration required to meet a leakage current requirement (e.g., $3E18\ cm^{-3}$) is greater than the indium solid solubility (e.g., on the order of $2E18\ cm^{-3}$).

Figure 5:
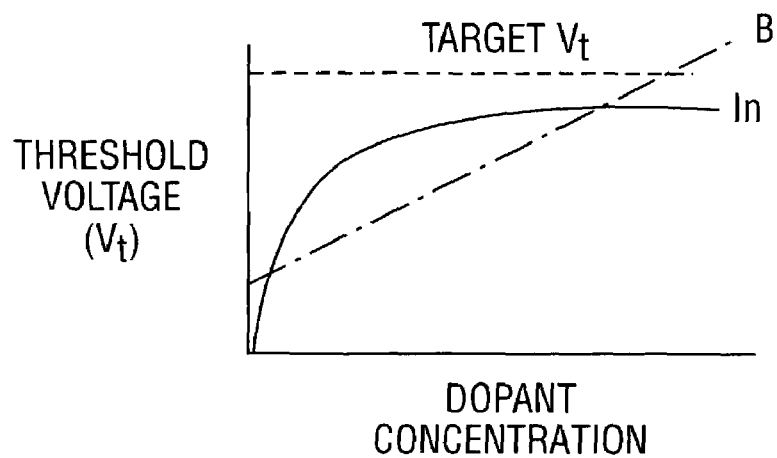
FIG. 5 shows a representative graph of threshold voltage versus P-type dopant concentration for a silicon substrate.
Figure 6:
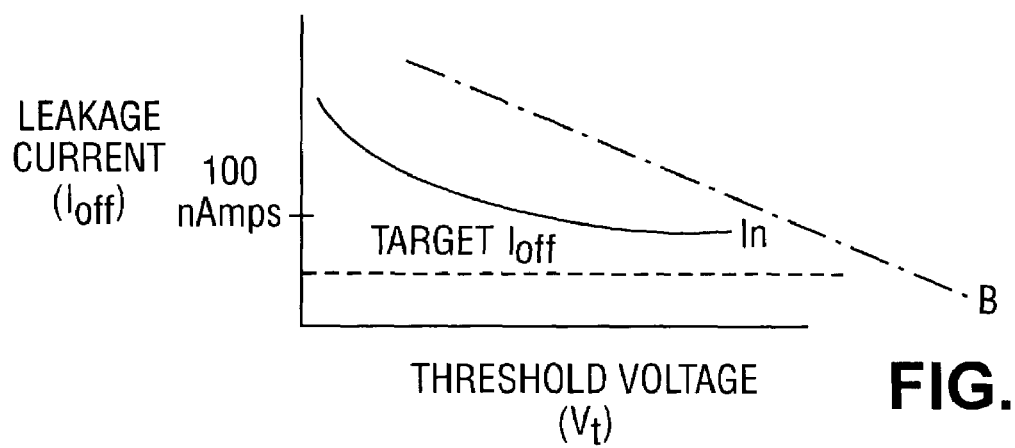
FIG. 6 shows a graphical representation of leakage current versus threshold voltage for P-type dopants.

FIG. 5 shows a graphical representation of threshold voltage versus dopant concentration. FIG. 5 demonstrates that at its solid solubility, indium saturates. FIG. 6 shows the graphical representation of leakage current versus threshold voltage. FIG. 6 demonstrates that at its solid solubility, indium again saturates (e.g., on the order of 100 nanoamps/µm). Thus, with respect to achieving target threshold voltages and target leakage currents, an additional halo implant, in addition to a halo implant including an indium species, is used. As shown in FIG. 5 and FIG. 6, a second halo implant of a boron species may be used to achieve the target threshold voltage and target leakage current.

Based on the above graphical representations, for example, where leakage current ($I_{off}$) for a worst-case gate length device is, for example, 100 nanoamps/µm, where a target gate length is, for example, 60 nanometers, an indium species may be introduced as a first halo to its solid solubility and a second halo of, for example, a boron species, may be introduced until a threshold voltage required to support the leakage current is established.

Figure 7:
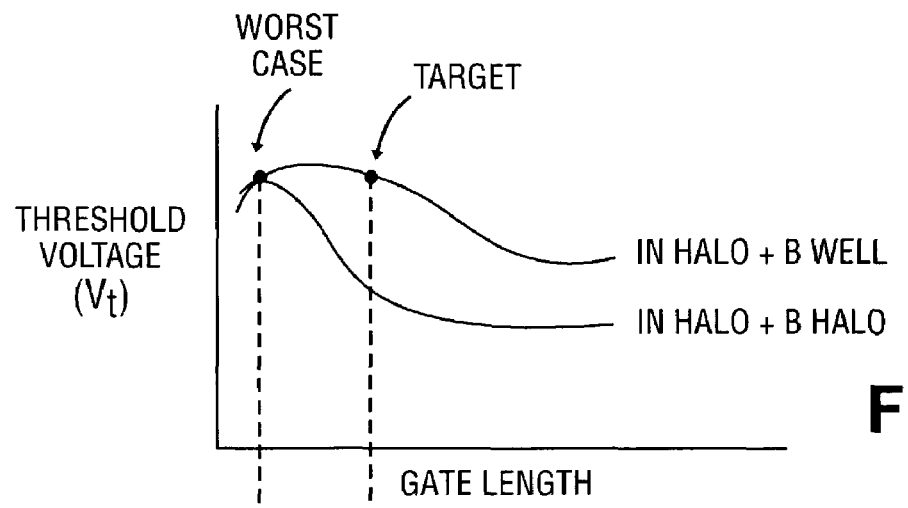
FIG. 7 shows a graphical representation of threshold voltage versus gate length for an NMOSFET device.
Figure 8:
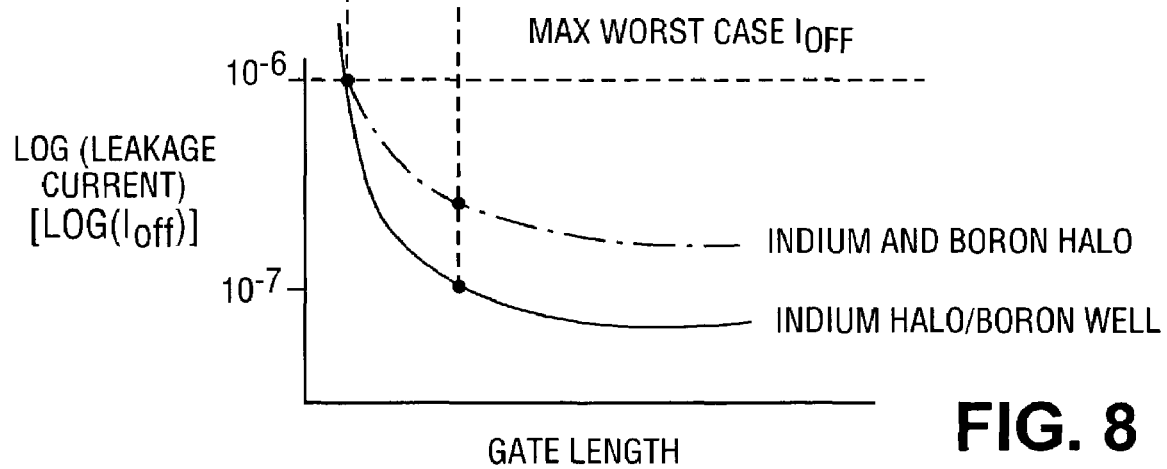
FIG. 8 shows a graphical representation of leakage current versus gate length for an NMOSFET.

FIGS. 7 and 8 show graphical representations associated with threshold voltages and leakage currents for a particular gate length device. The graphical representations illustrate the manufacturing tolerances associated with fabricating devices, particularly the acceptable variations in gate length. Representatively, for purposes of explanation, a target gate length is 70 nanometers (nm) with a worst-case gate length on the order of −10 nm. A halo implant, as illustrated in FIG. 7, tends to reduce the threshold voltage of the target size device while maintaining the threshold voltage of the worst case size device. However, the leakage current effects for various gate lengths are illustrated in FIG. 8. Representatively, for the prior art indium halo and boron well-type (indium halo/boron well) device, a worst-case gate length leakage current compared to a target gate length device, the difference between worst-case and target is on the order of a factor of 10. Thus, even though a worst-case device may dominate the total leakage current, a multiple halo device such as described tends to reduce the difference between the leakage current for a worst-case device and a target device by, representatively, a factor of two.

Figure 9:
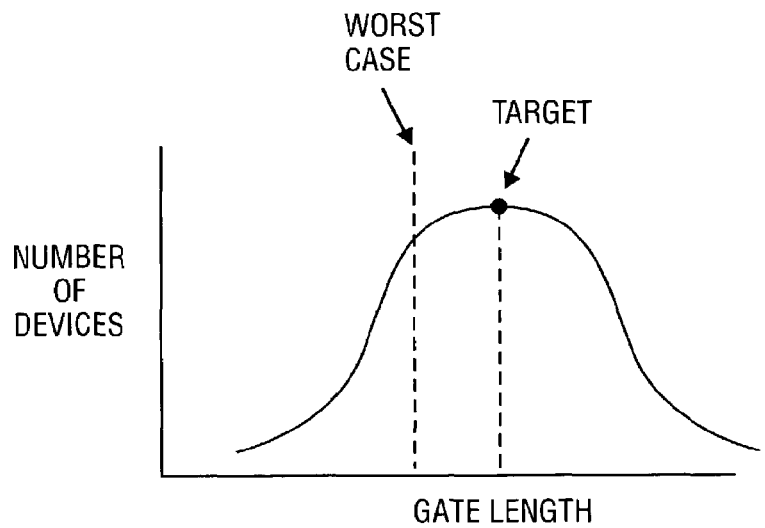
FIG. 9 shows a graphical representation of a number of devices on a substrate versus gate length.
Figure 10:
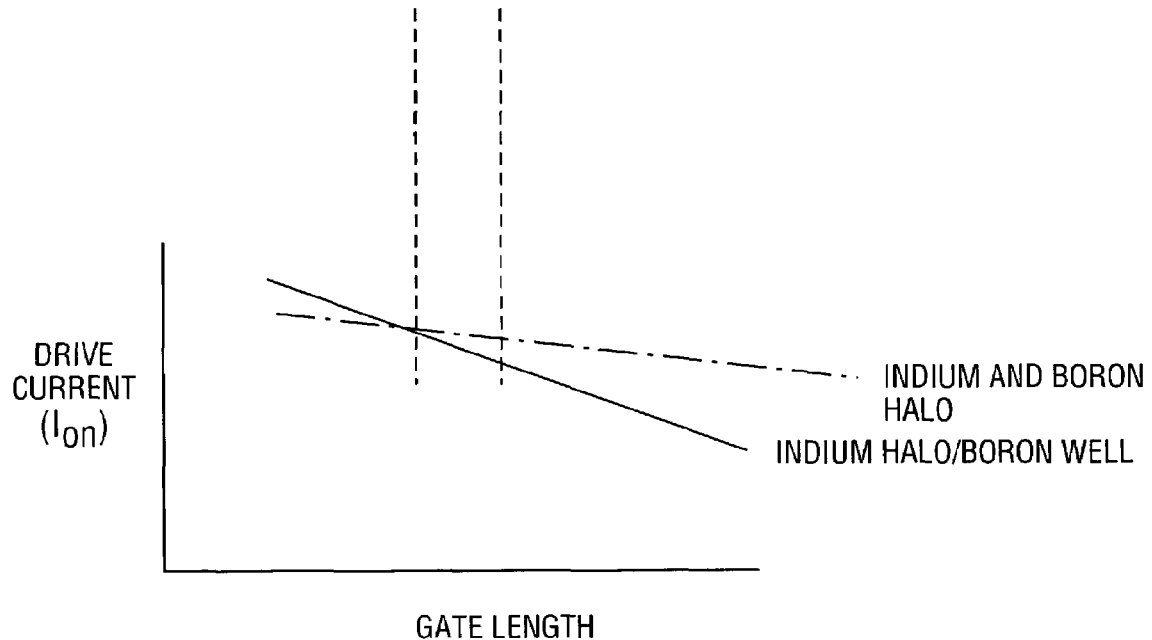
FIG. 10 shows a graphical representation of drive current versus gate length for a number of devices on a substrate.
Figure 11:
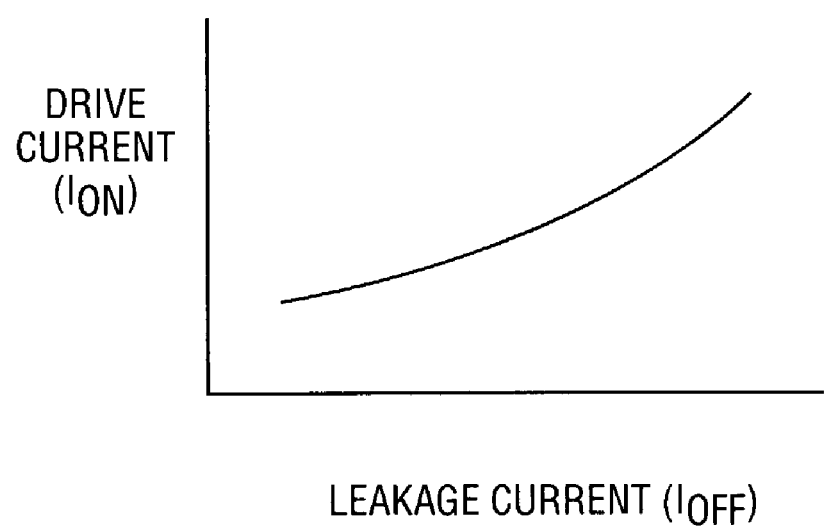
FIG. 11 shows a graphical representation of drive current versus leakage current for a transistor device.

Although a worst-case gate length device tends to dominate leakage current, the target devices tend to dominate drive current. FIGS. 9 and 10 illustrate a multiple halo device such as described above and a prior art single halo/boron well device. FIG. 9 shows a representation of devices formed on a substrate and their corresponding gate length. The devices adopt essentially a bell-shaped curve. FIG. 10 shows a typical drive current for the devices formed, in one case with a indium halo/boron well as in the prior art and, as multiple (indium and boron) halo devices. FIG. 10 shows that the multiple (indium and boron) halo devices tend to have higher drive currents at target gate lengths, because they have higher leakage currents at target gate lengths. FIG. 11 shows a graphical representation of drive current versus leakage current for a transistor device.

In the preceding detailed description, specific embodiments are illustrated, including a dual halo device of separate indium and boron implants. It will, however, be evident that various modifications and changes may be made thereto without departing from the broader spirit and scope of the invention as set forth in the claims. For example, indium and boron implants have been described for an N-type devices (P-type dopants). It is contemplated that other dopants for N-type devices may be introduced in a similar manner (e.g., multiple halo). Alternatively, for P-type devices, it is contemplated that N-type dopants such as arsenic and phosphorous may be introduced in a multiple halo process where effects such as, but not limited to, drive and leakage currents are to be optimized. The specification and drawings are, accordingly, to be regarded in an illustrative rather than a restrictive sense.

What is claimed is:

1. A method comprising:
    forming a plurality of transistor devices having a plurality of channel regions according to a target gate length;

implanting a first halo into the channel regions, wherein the concentration of the first halo in the channel regions is in an amount equivalent to the solid solubility of a material for the first halo in a material for the channel regions; and implanting a second different halo into the channel regions, wherein the target gate length is greater than a worst case acceptable gate length for the transistors, and a target leakage current for the target gate length is less than a target leakage current for a worst case acceptable gate length.

2. The method of claim 1, wherein the first halo comprises indium.

3. The method of claim 1, wherein an amount of the second halo is selected to achieve a leakage current less than a minimum leakage current achievable by implanting only the first halo.

4. The method of claim 3, wherein the second halo comprises boron.

5. The method of claim 1, wherein implanting the first halo into the channel regions is at a tilt angular range of approximately 25° to approximately 30°.

6. A method comprising:

implanting a first halo into a plurality of channel regions of a plurality of transistor devices formed according to a target gate length, wherein the concentration of the first halo in the channel regions is in an amount equivalent to the solid solubility of a material for the first halo in a material for the channel regions; and implanting a second different halo into the channel regions in an amount sufficient to achieve a target threshold voltage for the devices, wherein the target gate length is greater than a worst case acceptable gate length for the transistors, and a target drive current for the target gate length is less than a target drive current for the worst case acceptable gate length.

7. The method of claim 6, wherein the first halo comprises indium.

8. The method of claim 6, wherein the second halo comprises boron.

9. The method of claim 6, wherein implanting the first halo into the channel regions is at a tilt angular range of approximately 25° to approximately 30°.

10. A method comprising:

forming a plurality of transistors on a substrate according to a targeted gate length;

implanting a first halo into a channel region of each of the plurality of transistors, wherein the concentration of the first halo in the channel region is in an amount equivalent to the solid solubility of a material for the first halo in a material for the channel region; and implanting a second halo into the channel region of each of the plurality of transistors in an amount sufficient to achieve a target threshold voltage for a worst case acceptable gate length from the targeted gate length, wherein the target gate length is greater than the worst case acceptable gate length for the transistors, and the target threshold voltage for the target gate length is less than a target threshold voltage for the worst case acceptable gate length.

11. The method of claim 10, wherein the first halo comprises indium.

12. The method of claim 10, wherein the second halo comprises boron.

13. The method of claim 10, wherein implanting the first halo into the channel regions is at a tilt angular range of approximately 25° to approximately 30°.

14. An apparatus comprising:

a plurality of gate electrodes formed on a substrate according to a target gate length;

a plurality of channel regions formed in the substrate below the gate electrodes and between contact points;

a first halo implant comprising a first species in the channel regions, wherein the concentration of the first halo in the channel regions is in an amount equivalent to the solid solubility of a material for the first halo in a material for the channel regions; and a second halo implant comprising a different second species in the channel regions, wherein the target gate length is greater than a worst case acceptable gate length for the gate electrodes, a target threshold voltage for the target gate length is less than a target threshold voltage for the worst case acceptable length, a target leakage current for the target gate length is less than a target leakage current for the worst case acceptable gate length, and a target drive current for the target gate length is less than a target drive current for the worst case acceptable gate length.

15. The apparatus of claim 14, wherein the first halo comprises indium.

16. The apparatus of claim 14, wherein the second halo comprises boron.

* * * * *